United States Patent
Lissotschenko (10) Patent No.: US 11,433,609 B2
(45) Date of Patent: Sep. 6, 2022

(54) APPARATUS FOR GENERATING ELECTRON RADIATION AND 3D PRINTING APPARATUS

(71) Applicant: Vitalij Lissotschenko, Fröndenberg (DE)

(72) Inventor: Vitalij Lissotschenko, Fröndenberg (DE)

( * ) Notice: Subject to any disclaimer, the term of this patent is extended or adjusted under 35 U.S.C. 154(b) by 84 days.

(21) Appl. No.: 17/018,657

(22) Filed: Sep. 11, 2020

(65) Prior Publication Data
US 2021/0078252 A1    Mar. 18, 2021

(30) Foreign Application Priority Data
Sep. 13, 2019 (DE) ................. 102019124684.9

(51) Int. Cl.
| | |
|---|---|
| *B29C 64/268* | (2017.01) |
| *B33Y 30/00* | (2015.01) |
| *H01J 37/30* | (2006.01) |
| *H01J 37/147* | (2006.01) |
| *H01J 37/063* | (2006.01) |

(52) U.S. Cl.
CPC ........... *B29C 64/268* (2017.08); *B33Y 30/00* (2014.12); *H01J 37/063* (2013.01); *H01J 37/147* (2013.01); *H01J 37/30* (2013.01)

(58) Field of Classification Search
None
See application file for complete search history.

(56) References Cited

U.S. PATENT DOCUMENTS

| | | | |
|---|---|---|---|
| 3,514,664 A | 5/1970 | McCann | |
| 2005/0232396 A1* | 10/2005 | Chidester | H01J 35/066 378/136 |
| 2015/0144800 A1* | 5/2015 | Lissotschenko | H01J 3/30 250/396 R |

FOREIGN PATENT DOCUMENTS

| | | |
|---|---|---|
| DE | 1805848 A1 | 7/1969 |
| DE | 4432984 A1 | 3/1996 |
| DE | 19638925 A1 | 4/1998 |
| DE | 102014001344 A1 | 8/2015 |
| EP | 1777726 | * 1/2013 |

* cited by examiner

*Primary Examiner* — Ashok Patel
(74) *Attorney, Agent, or Firm* — Edell, Shapiro & Finnan, LLC.

(57) ABSTRACT

An apparatus for generating electron radiation comprises a wire-shaped hot cathode that is much more extensive in a longitudinal direction than in a transverse direction. Electron radiation emerges from the hot cathode that, due to the elongated shape of the hot cathode, exhibits an elongated, line-shaped cross section perpendicular to its direction of propagation, where the extension in longitudinal direction of the line is significantly greater than in transverse direction of the line. The apparatus further comprises a cathode electrode and an anode. A voltage for accelerating the electrons emitted from the hot cathode is applied between the cathode electrode and the anode. The hot cathode is arranged to be spaced apart from the cathode electrode such that electrons that are accelerated to the anode are emitted from the hot cathode in each of the transverse directions.

11 Claims, 11 Drawing Sheets

Prior Art

Fig. 13

Prior Art

Fig. 14

Prior Art

Fig. 15

Prior Art

Fig. 16

Prior Art

Fig. 17

Prior Art

Fig. 18

Prior Art

APPARATUS FOR GENERATING ELECTRON RADIATION AND 3D PRINTING APPARATUS

CROSS REFERENCE TO RELATED APPLICATIONS

This application claims foreign priority under 35 U.S.C. § 119(a)-(d) to Application No. DE 102019124684.9 filed on Sep. 13, 2019, the entire contents of which are hereby incorporated by reference.

TECHNICAL FIELD

The disclosure relates to an apparatus for generating electron radiation, a three-dimensional (3D) printing apparatus for producing a spatially extended product, and an apparatus for machining a workpiece with such an apparatus.

BACKGROUND

Apparatuses for generating electron radiation are well known and can be designed, for example, as Pierce electron guns. One example of an apparatus designed as a Pierce electron gun is disclosed in the patent document WO 2014/009028 A1.

Figure 14:
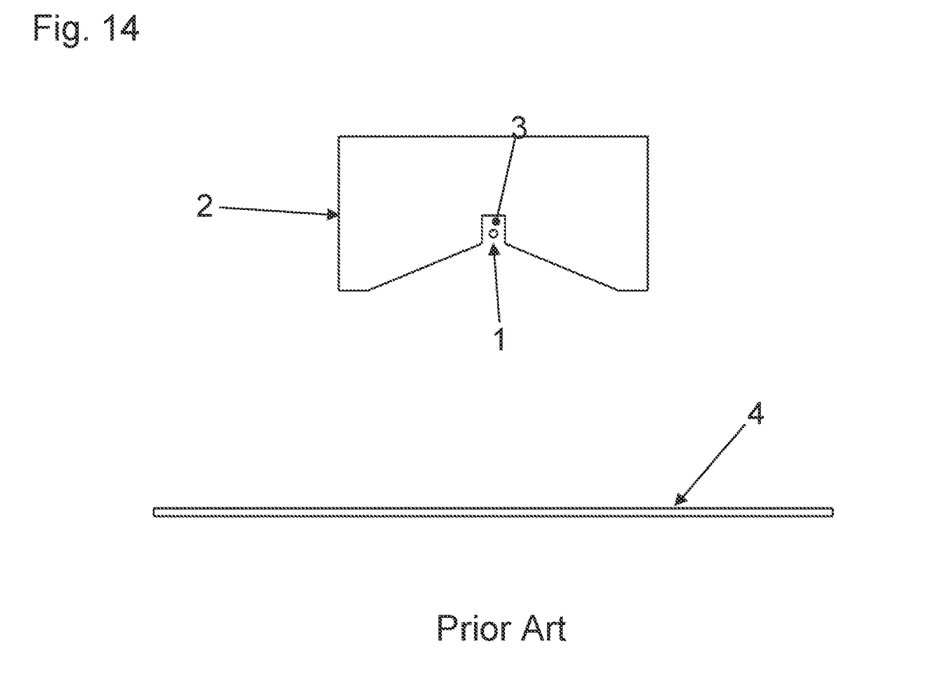
FIG. 14 is, in schematic form, a side view of a second embodiment of an apparatus that is intended for generating electron radiation and that is designed as a Pierce electron gun.
Figure 15:
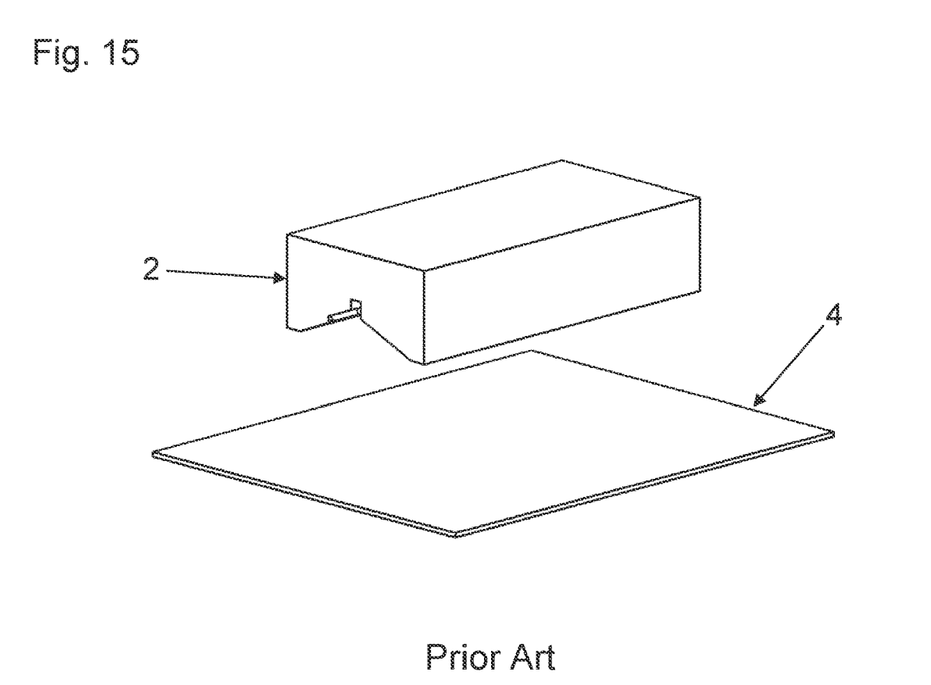
FIG. 15 is a perspective view of the apparatus according to FIG. 14.

Electron guns of the Pierce type have a plethora of drawbacks. In order to explain these drawbacks, reference is made to FIG. 12 to FIG. 18. The apparatuses that are shown in these figures comprise a wire-shaped hot cathode 1 that extends much more in a longitudinal direction than in a transverse direction perpendicular thereto. Furthermore, the apparatuses comprise a cathode electrode 2 that has a longitudinal groove 3, in which the hot electrode 1 is disposed. In this case, the longitudinal groove 3 has a rectangular cross section, wherein the extension of the longitudinal groove is about three times as great in the transverse direction as the diameter of the hot cathode 1 is (see FIG. 14 and FIG. 18).

Furthermore, FIGS. 12 to 17 show an anode electrode 4. Between the cathode 2 and the anode electrode 4 a voltage of, for example, up to 50 kV is applied in order to accelerate the electrons emitted from the hot cathode 1. Furthermore, a low voltage of, for example, about 10 V, is applied to the hot cathode 1, so that a current flows through the hot cathode 1 that causes the hot cathode 1 to heat up. Due to this heating voltage, the differences in voltage between the hot cathode 1 and the cathode electrode 2 vary at the beginning and at the end of the cathode electrode 2.

Figure 16:
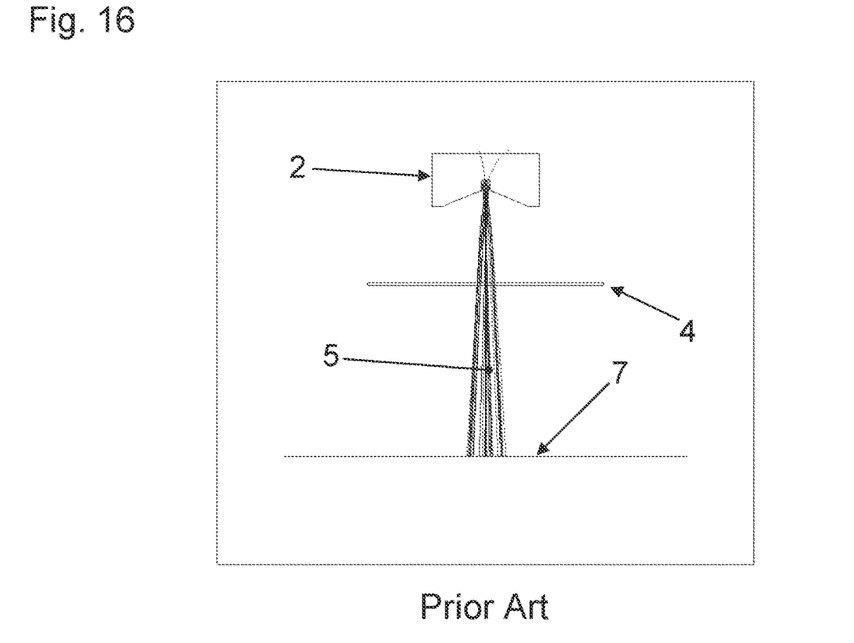
FIG. 16 is, in schematic form, a side view of a third embodiment of an apparatus that is intended for generating electron radiation and that is designed as a Pierce electron gun, wherein the generated electron radiation is illustrated.
Figure 17:
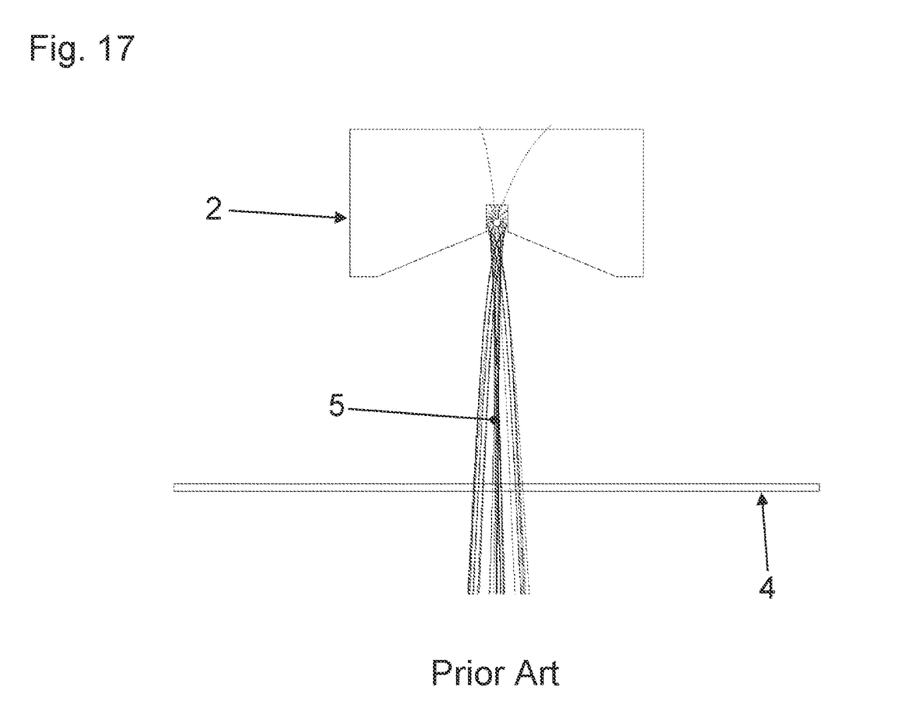
FIG. 17 is an exploded view of a detail from FIG. 16.
Figure 18:
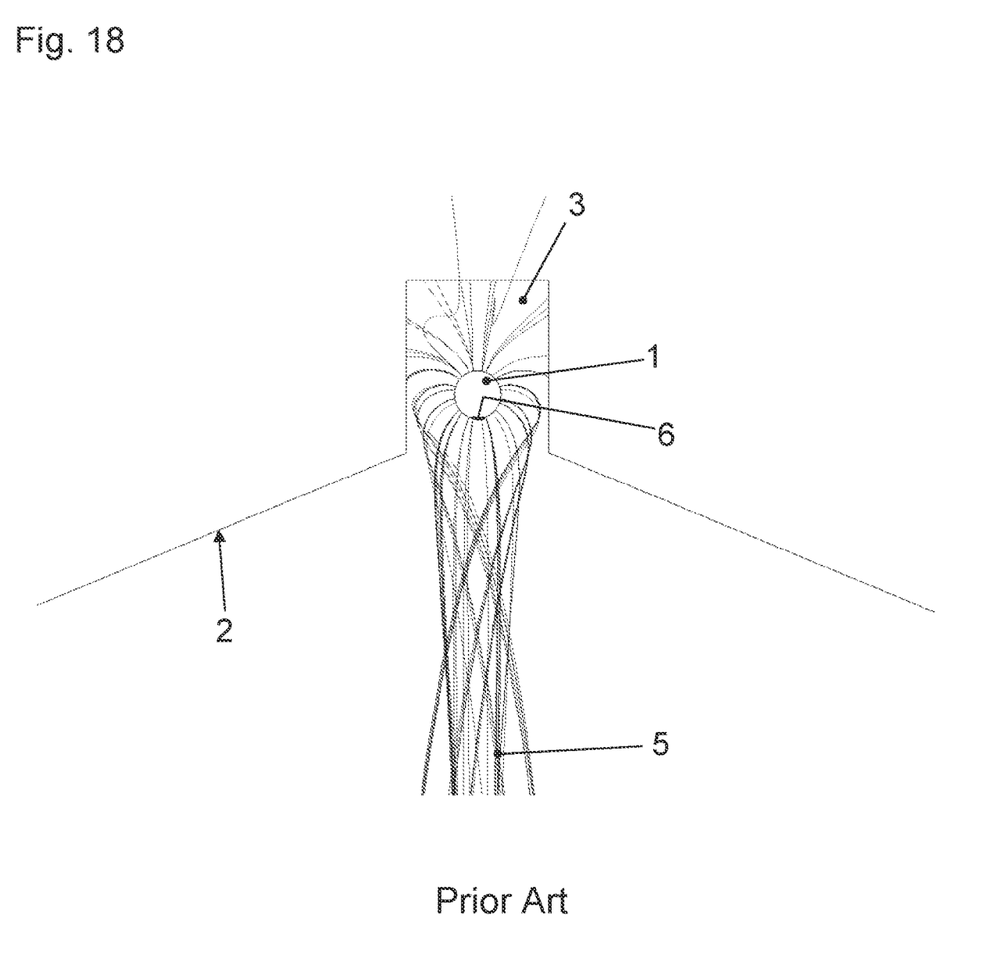
FIG. 18 is an exploded view of a detail from FIG. 17.

FIGS. 16 to 18 show the electrode radiation 5 emerging from the hot cathode 1 in the direction of the anode electrode 4 where, in this case, owing to the shape of the hot cathode 1, the electrode radiation 5 has an elongated, line-shaped cross section (not shown) perpendicular to its direction of propagation, as a result of which the extension in the longitudinal direction of the line is much greater than in the transverse direction of the line.

It can be seen from the schematic drawing according to FIG. 18 that only the electrons emitted from the side of the hot cathode 1 facing the anode electrode 4 contribute to the electrode radiation 5. However, in real-life applications, the area from which the electrons that contribute to the electrode radiation 5 are emitted is further reduced to a narrow strip 6 extending in the longitudinal direction of the hot cathode 1. In FIG. 18, this strip is shown in a central region of that side of the hot cathode 1 that faces the anode electrode 4.

What has proved to be a disadvantage of such apparatuses designed as Pierce electron guns is the relative non-homogeneity of the electrode radiation 5 in the longitudinal direction of the line. The reason lies in the fact that most of the tungsten wires, which are used as hot cathodes 1, are usually polycrystalline, where in this case the energy, which has to have electrons moving in the polycrystals in order to be emitted from the crystal, may vary for the individual polycrystals. Since a plurality of various polycrystals are arranged side by side in the longitudinal direction of the hot cathode 1 or, more specifically, in the longitudinal direction of the strip 6, the result is a plurality of varying energies of the electrons in the longitudinal direction of the profile of the electron radiation 5.

Furthermore, it is apparent that the intensity distribution of the electron radiation 5 depends in a very sensitive way on the alignment of the wire-shaped hot cathode 1 in the groove 3 of the cathode electrode 2. Since the voltage differences, caused by the heating voltage, between the hot cathode 1 and the cathode electrode 2 vary at the beginning and at the end of the cathode electrode 2, the hot cathode 1 has to be arranged at a small angle to the longitudinal direction of the groove 3 in the groove in order to achieve electron radiation 5 with the same intensity at the ends of the line-shaped distribution. This slight tilt of the hot cathode 1 in the groove 3 is associated, on the one hand, with very time-consuming adjustment work due to the aforementioned sensitive dependence of the intensity distribution on the alignment. On the other hand, the slight tilt limits the possible lengths of the line-shaped intensity distribution to, for example, about 100 mm.

Furthermore, the susceptibility of such apparatuses that are designed as Pierce electron guns to particle vapors, which can emerge from a workpiece 7 to be machined or from a starting material, exposed to electron radiation for the 3D printing when the apparatus is in operation, has proved to be a drawback. The particles can settle, in particular, on the edge of the groove 3 and form there material accumulations, which can influence the generation of the electron radiation 5 or, more specifically, can drastically reduce the quality thereof.

SUMMARY

An object of what is disclosed is to provide an apparatus of the aforementioned type, which is more effective and/or with which a more homogeneous electron radiation can be generated and/or with which greater line lengths can be achieved and/or which is more insensitive to particle vapors. Furthermore, a 3D printing apparatus as well as an apparatus for machining a workpiece of the aforementioned type with such an apparatus is disclosed herein.

The aforementioned object is achieved by an apparatus having a hot cathode arranged so as to be spaced apart from the cathode electrode such that, when the apparatus is in operation, electrons that are accelerated to the anode are emitted from the hot cathode in each of the transverse directions.

Due to the fact that electrons, which have been emitted from the hot cathode in all of the radial directions, contribute to the electron radiation, the effectiveness of the apparatus is enhanced, because at the same acceleration voltage the current is increased.

Furthermore, due to the fact that electrons that have been emitted from the hot cathode in all radial directions contribute to the electron radiation, a larger number of sections of the surface of the hot cathode contribute to the electron radiation. This means that more polycrystals contribute to the individual regions of the electron radiation in the longitudinal direction of the intensity distribution, as a result of which the energies of the individual regions are averaged over a larger number of polycrystals. The result is a greater homogeneity of the electron radiation in the longitudinal direction of the line.

According to one option, the cathode electrode has a smooth surface and/or a non-interrupted surface on the side facing the hot cathode. As a result, the surface is not interrupted, in particular, by a groove or the like. Because of a smooth, non-interrupted surface of the cathode electrode, which does not have, in particular, a groove, the apparatus is more insensitive to particle vapors. There is, in particular, no groove with an edge, on which particles could be deposited and where material accumulations could form. Furthermore, with a smooth, non-interrupted surface of the cathode electrode, the apparatus is much more insensitive to slight tilts of the hot cathode so that the time required for adjustments is reduced. Furthermore, this feature makes it possible to provide apparatuses that can generate electron radiations of longer line lengths.

The cathode electrode can have a curved surface on the side facing the hot cathode. In particular, the cathode electrode can have a hollow cylindrical, concavely curved surface. In this case the hollow cylindrical, concavely curved surface of the cathode electrode may have a vertex line, preferably a surface with a parabola-shaped cross section. In this case the distance between the hot cathode and the surface of the cathode electrode in the region of the vertex line of the concave curvature, in particular, in the region of the extremum of the parabola, may be smaller than the distance between the hot cathode and other regions of the surface of the cathode electrode. Such an arrangement of the hot cathode in front of the cathode, in particular, in front of a vertex line of the curved cathode surface, makes the apparatus even more insensitive to slight tilts of the hot cathode, so that the time required for adjustments is further reduced, and the electron radiations can be generated with even longer line lengths. Furthermore, by the hot cathode portions of the surface, in particular, the vertex line and its environment, are shaded by the hot cathode, so that no vapor deposition with particles can take place in this region.

According to another option, the electrons emitted from the hot cathode in the direction of the cathode electrode when the apparatus is in operation are reflected on the surface or in the region of the surface of the cathode electrode in the direction of the anode or are deflected in the direction of the anode. In this way, it is ensured that in essence all of the electrons emitted from the hot cathode in radial directions contribute to the electron radiation.

The workpiece to be machined can be used as an anode. This aspect can be implemented, especially if the apparatus for generating electron radiation is used in an apparatus for machining a workpiece. The use of the workpiece as an anode makes it possible to dispense with a separate anode electrode. This aspect is possible especially if the apparatus is relatively insensitive to particle vapors. This means that the dimensions of the apparatus can be significantly reduced.

As an alternative, it may be provided that the anode is designed as an anode electrode that has, in particular, an opening, through which the electron radiation, emerging from the hot cathode, can pass. This aspect can be implemented, especially if the apparatus for generating electron radiation is used in a 3D printing apparatus for the production of a spatially extended product.

According to another option, the apparatus comprises at least one deflection electrode, preferably a plurality of deflection electrodes, where the at least one deflection electrode is used, in particular, for compression and/or for focusing the electrode radiation. In this case, the at least one deflection electrode can be arranged behind the anode electrode in the direction of propagation of the electron radiation.

BRIEF DESCRIPTION OF THE DRAWINGS

Other features and advantages of the described apparatuses will become apparent from the following description of example embodiments with reference to the accompanying drawings.

DETAILED DESCRIPTION

Identical or functionally identical parts or elements are provided with the same reference numerals in the figures.

The illustrated apparatuses comprise a hot cathode 11, a cathode electrode 12 and an anode electrode 13. The apparatus can generate electron radiation 14 (see FIG. 9 to FIG. 11).

In all of the embodiments, the hot cathode 11 is constructed as a wire and extends into the drawing plane of FIG. 1, FIG. 3, FIG. 5, FIG. 7, and FIGS. 9 to 11 or, more specifically, in a longitudinal direction that is arranged perpendicular to the direction of propagation of the electron radiation 14. Owing to this configuration, a line-shaped cross section of the electron radiation 14 is achieved, wherein the longitudinal direction of the line-shaped cross section is aligned parallel to the longitudinal direction of the wire forming the hot cathode 11.

In the illustrated embodiments, the anode electrode 13 comprises two parts 13*a*, 13*b*, which are spaced apart from one another and between which the electron radiation 14 can pass through. Instead of a multiple piece anode electrode 13, a single piece anode electrode 13 can also be provided. Then the single piece anode electrode may have an opening, through which the electron radiation 14, emerging from the hot cathode 12, can pass. The opening can be, in particular, rectangular and may have a much larger dimension in its longitudinal direction, which extends into the drawing plane of FIG. 1, than in its transverse direction, in order to let the line-shaped electron radiation 14 pass through.

The hot cathode 11 is supplied by a voltage source, which is not shown, with a voltage such that a current flows through the hot cathode 11 that causes the hot cathode 11 to heat up. In this case, the hot cathode 11 may be at least partially at the same potential as the cathode electrode 12.

When the apparatus is in operation, a voltage generated by a voltage source (not shown) and intended for accelerating the electrons emitted from the hot cathode 11 is applied between the cathode electrode 12 and the anode electrode 13. The voltage may be, for example, between 1 kV and 10 kV. In this case, the cathode electrode 12 is connected to the negative pole, and the anode electrode 13 is connected to the positive pole of the voltage source, wherein, in particular, the anode electrode 13 can additionally be connected to ground.

According to one option, the anode electrode can be dispensed with in the apparatus. In this case, a metallic workpiece that is to be machined can be used, for example, as an anode.

The cathode electrode 12 has a cavity 15 that is open on one side and in which the hot cathode 11 is disposed. The surface 16 of the cathode electrode 12 that forms the cavity 15 is smooth or, more specifically, not interrupted. The surface 16 is constructed so as to be hollow cylindrical and concavely curved, where in this case the surface 16 has, in particular, a parabola-shaped cross section. As a result, the concavely curved surface 16 of the cathode electrode 12 has a vertex line 17 that extends into the drawing plane in FIG. 11. The hot cathode 11 is disposed in front of the vertex line 17 or, more specifically, in front of the extremum of the parabola (see FIG. 1). In this case, the hot cathode 11 is at a distance from the surface 16 of the cathode electrode 12, where the distance is less in the region of the vertex line 17 or, more specifically, in the region of the extremum of the parabola than the distance between the hot cathode 11 and other regions of the surface 16 of the cathode electrode 12.

Figure 11:
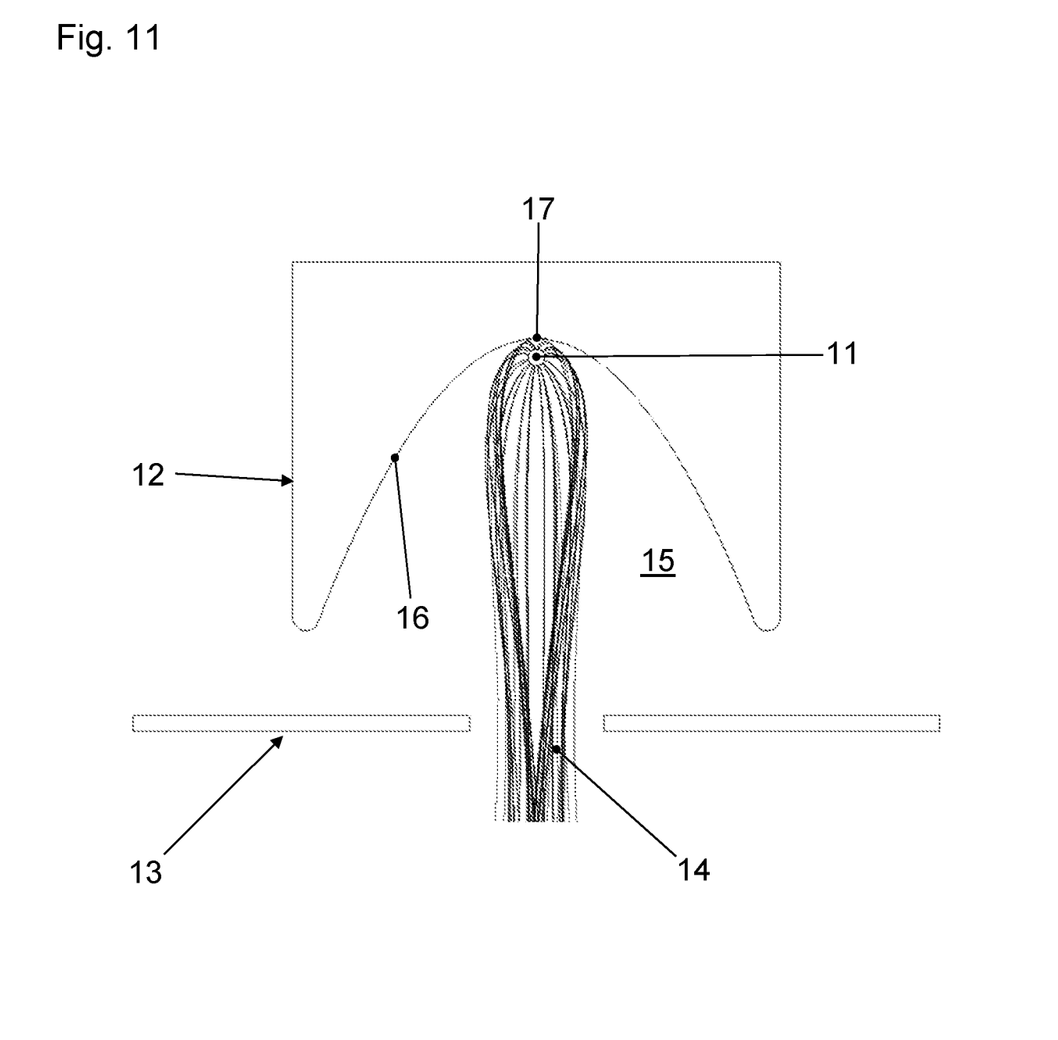
FIG. 11 is an exploded view of a detail from FIG. 10.
Figure 12:
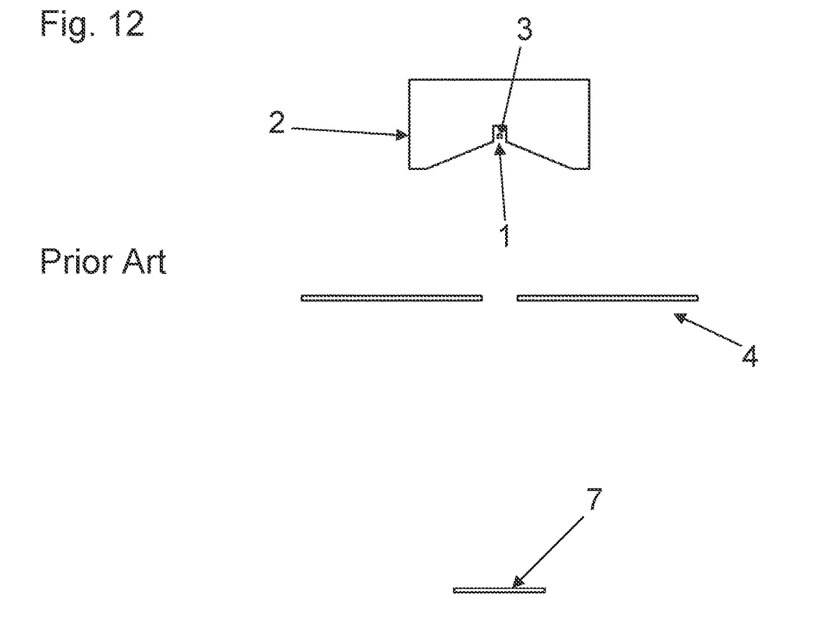
FIG. 12 is, in schematic form, a side view of a first embodiment of an apparatus that is intended for generating electron radiation and that is designed as a Pierce electron gun.
Figure 13:
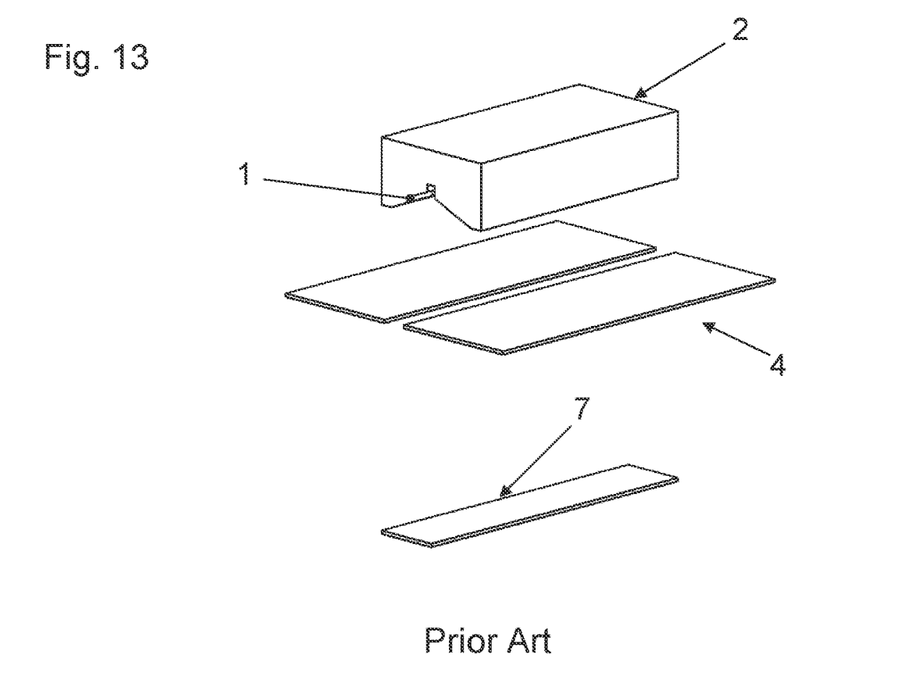
FIG. 13 is a perspective view of the apparatus according to FIG. 12.

FIG. 11 shows that even the electrons emitted from the hot cathode 11 upwards in FIG. 11 or, more specifically, in the direction of the vertex line 17, are deflected downwards in the direction of the anode electrode 13. Therefore, when the apparatus is in operation, the electrons, emitted from the hot cathode 11 in the direction of the cathode electrode 12, are reflected on the surface 16 or in the region of the surface 16 of the cathode electrode 12 in the direction of the anode electrode 13 or are deflected in the direction of the anode electrode 13. In this way, it is ensured that in essence all of the electrons emitted from the hot cathode 11 in radial directions contribute to the electron radiation 14.

Figure 1:
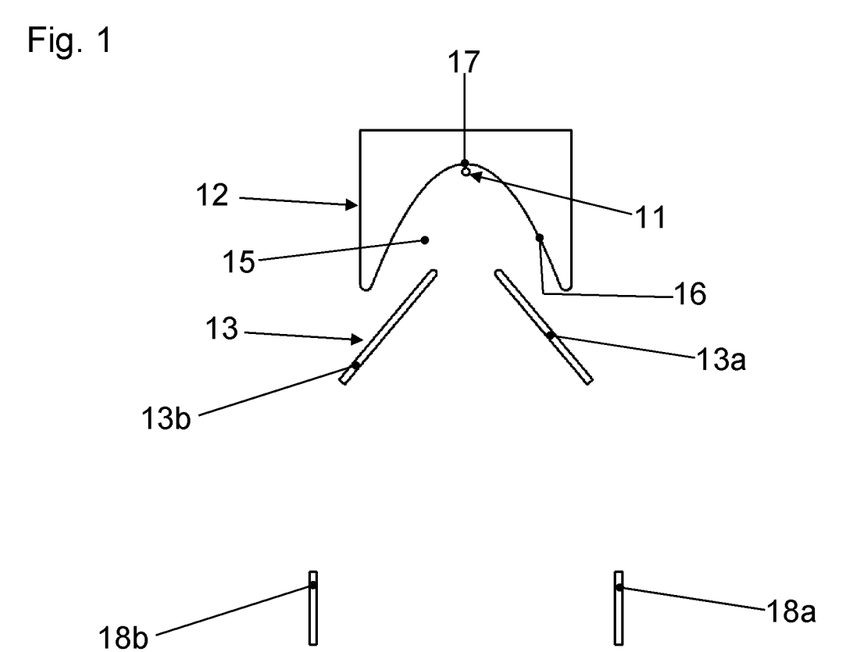
FIG. 1 is, in schematic form, a side view of a first embodiment of an apparatus for generating electron radiation.
Figure 2:
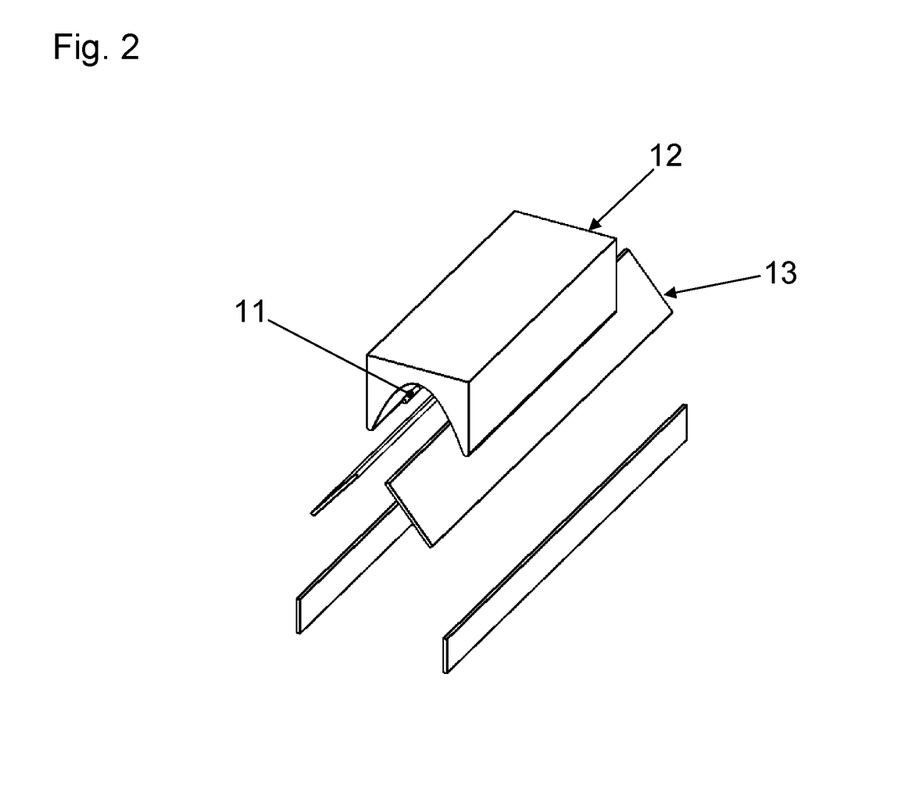
FIG. 2 is a perspective view of the apparatus according to FIG. 1.
Figure 3:
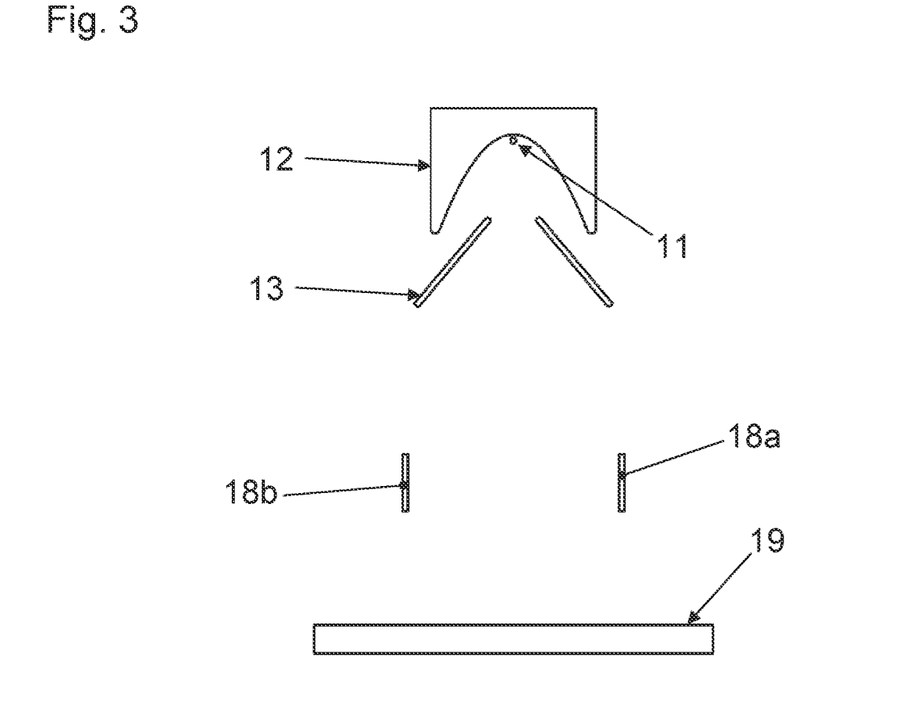
FIG. 3 is, in schematic form, a side view of a second embodiment of an apparatus for generating electron radiation.
Figure 4:
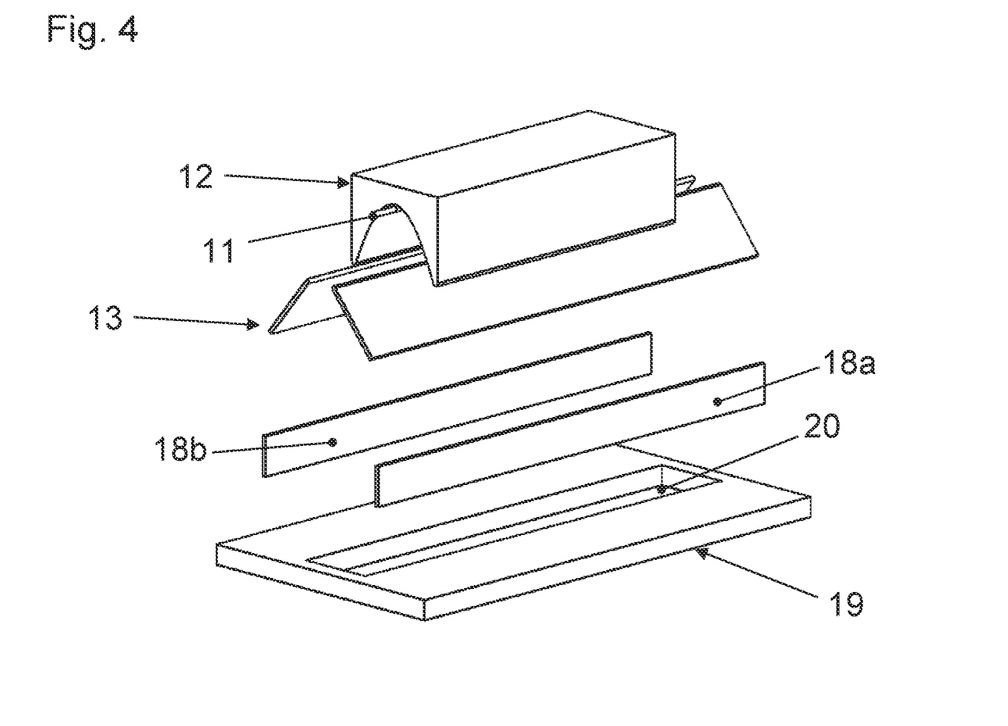
FIG. 4 is a perspective view of the apparatus according to FIG. 3.

Furthermore, the embodiment according to FIGS. 1 and 2 comprises two deflection electrodes 18*a*, 18*b* behind the anode electrode 13 in the direction of propagation of the electron radiation 14. It is also possible to dispense with the two deflection electrodes 18*a*, 18*b*. They are used only to form the beam profile of the electron radiation 14.

Furthermore, the embodiments according to FIGS. 3 to 8 comprise in the direction of propagation of the electron radiation 14 behind the deflection electrodes 18*a*, 18*b* an additional electrode 19 that has an opening 20 for the passage of the electron radiation 14. The additional electrode 19 may have a positive potential with respect to the deflection electrodes 18*a*, 18*b* so that the electrons of the electron radiation 14 are accelerated in the direction of the additional electrode 19 and pass through the opening 20.

The individual embodiments are distinguished to some extent by the configuration of the anode electrode 13. In the embodiments in FIGS. 1 to 4, the anode electrode 13 comprises two flat, plate-shaped parts 13*a*, 13*b*, which are spaced apart from one another. The parts are inclined towards the horizontal in the drawings such that their mutually facing ends extend upwards into the cavity 15 of the cathode electrode 12.

Figure 5:
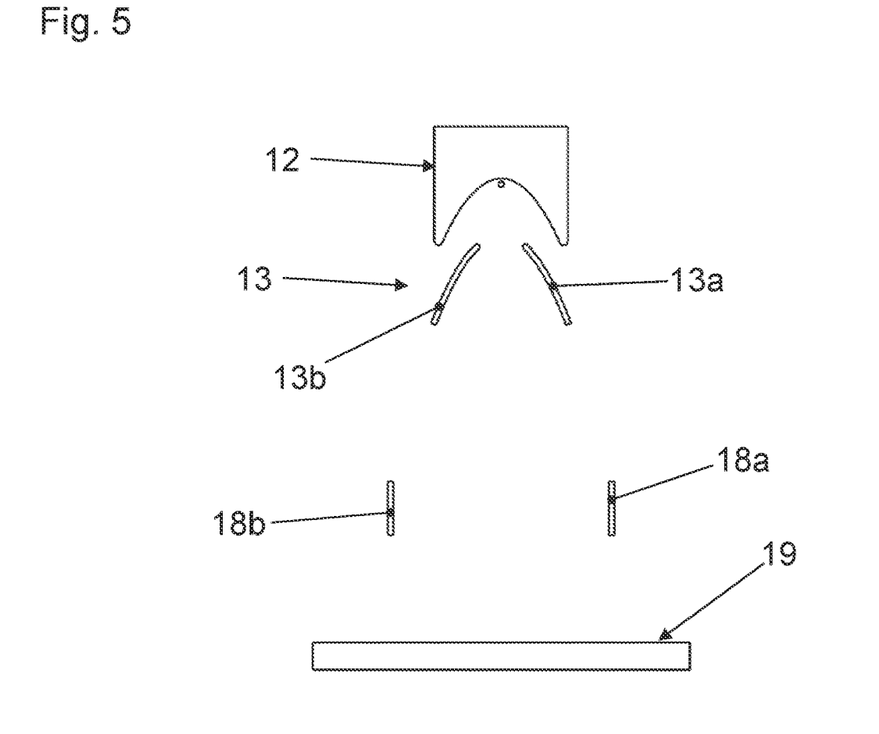
FIG. 5 is, in schematic form, a side view of a third embodiment of an apparatus for generating electron radiation.
Figure 6:
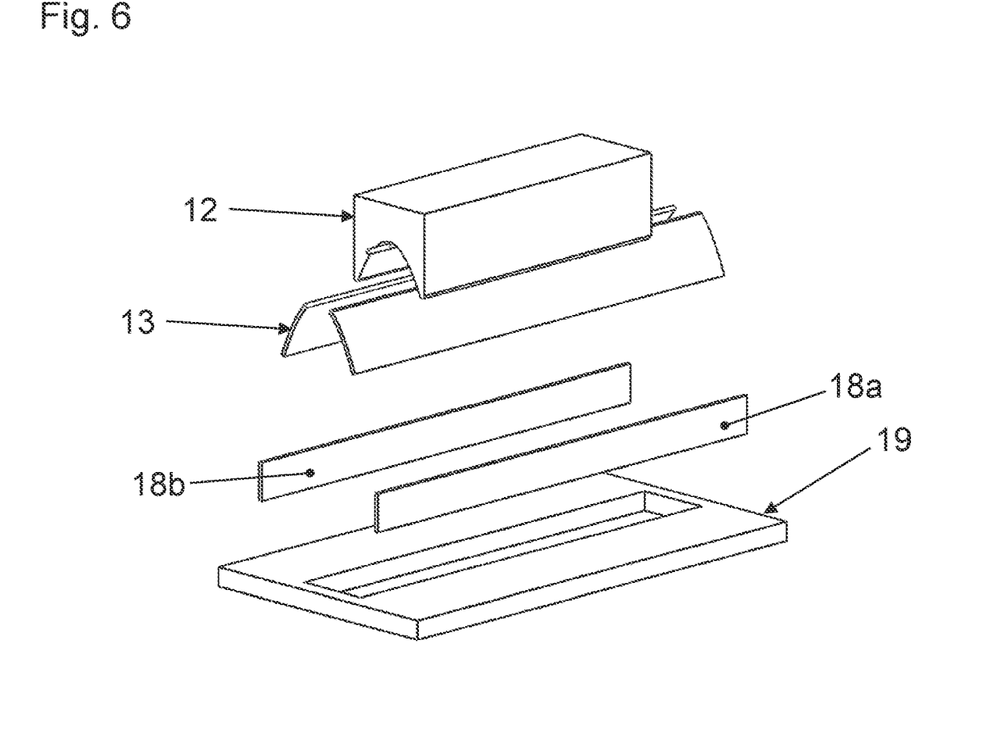
FIG. 6 is a perspective view of the apparatus according to FIG. 5.
Figure 7:
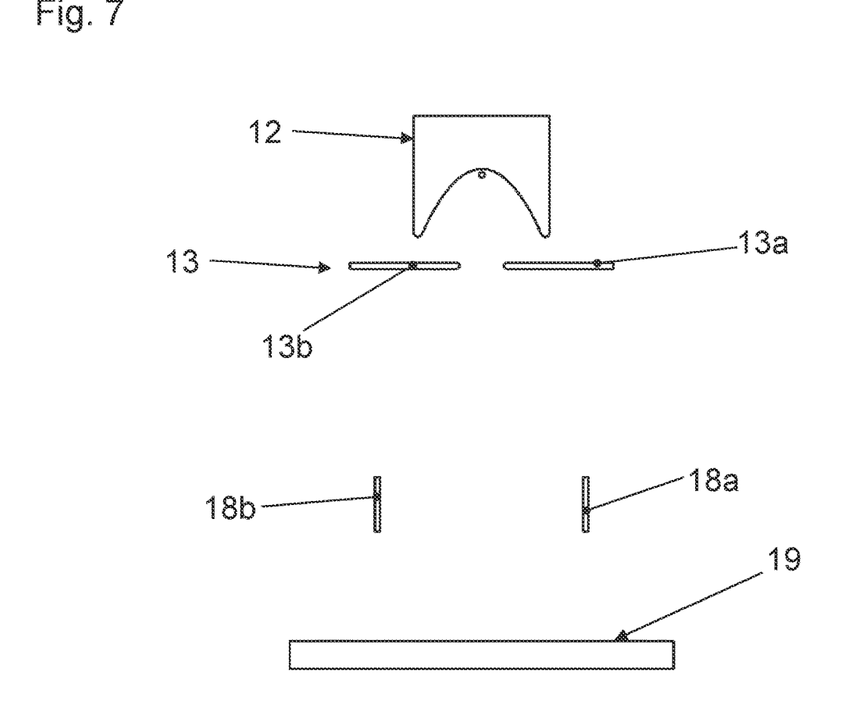
FIG. 7 is, in schematic form, a side view of a fourth embodiment of an apparatus for generating electron radiation.
Figure 8:
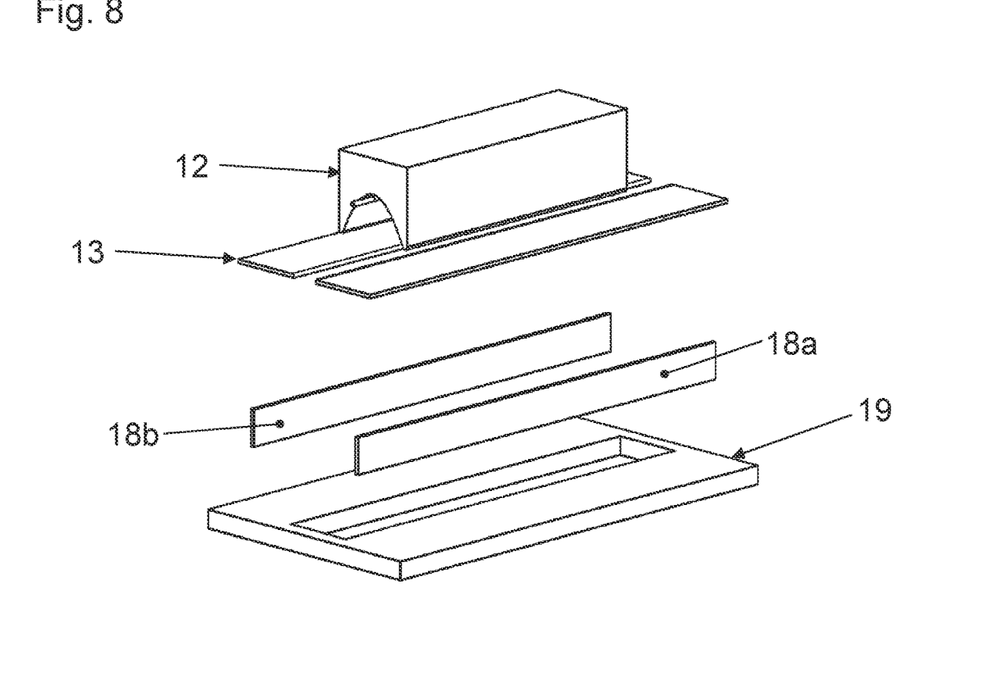
FIG. 8 is a perspective view of the apparatus according to FIG. 7.

In the embodiment according to FIGS. 5 and 6, the parts 13*a*, 13*b* are arranged in a similar way. However, they are not designed so as to be flat, but rather curved.

In the embodiments in FIGS. 7 to 11, the parts 13*a*, 13*b* are constructed so as to be flat, as in the first embodiments, according to FIGS. 1 to 4. However, they are not inclined towards the horizontal in the drawings, so that their mutually facing ends do not extend upwards into the cavity 15 of the cathode electrode 12.

Figure 19:
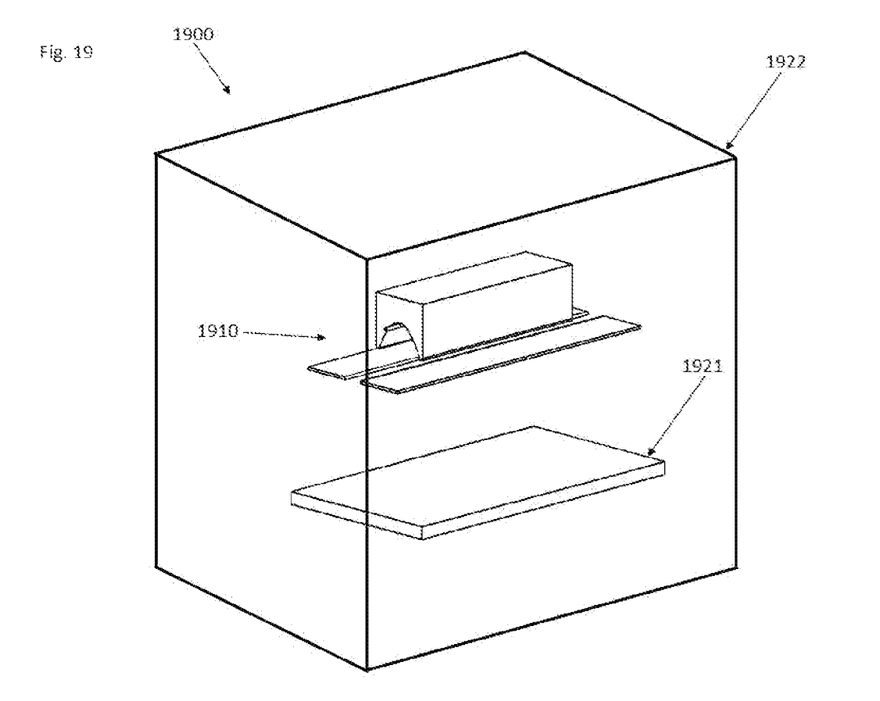
FIG. 19 is general diagram of a generic three-dimensional (3D) printing apparatus that includes a working region and an apparatus configured that generates electron radiation, according to an exemplary embodiment of the present application.
Figure 20:
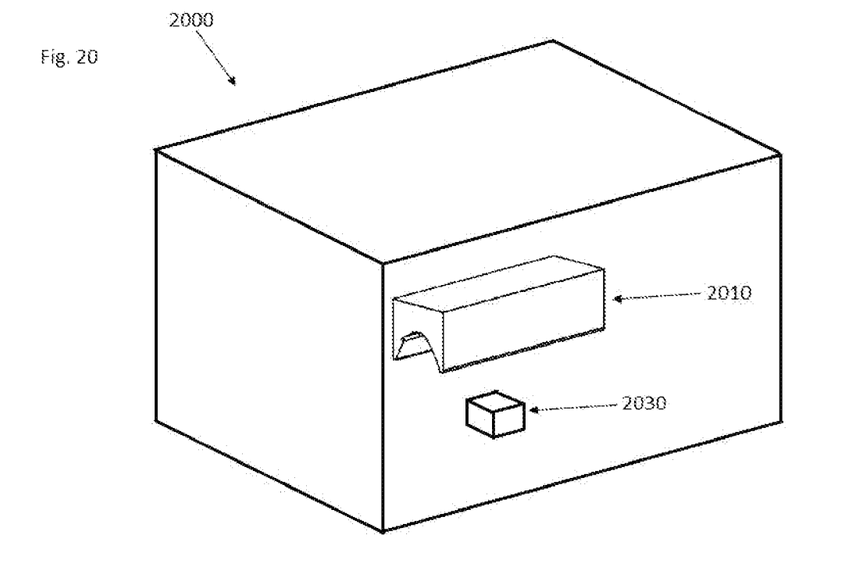
FIG. 20 is general diagram of a generic apparatus that for machining a workpiece that includes an apparatus that generates electron radiation, according to according to an exemplary embodiment of the present application.

The apparatus for generating electron radiation may be integrated in a 3D printing apparatus for the production of a spatially extended product. To this end, then for the 3D printing a bar-shaped starting material that is made of metal and that can be melted by the electron radiation 14 can be arranged, for example, in a working region 21 (see FIG. 9). As an alternative, a starting material in powder form can also be provided. FIG. 19 shows a generic three-dimensional (3D) printing apparatus 1900 including a housing 1922 that houses a working region 1921 and an apparatus 1910 that generates electron radiation. The working region 1921 may be arranged such that a starting material, fed by the 3D printing apparatus 1900, is exposed to electron radiation emitted by the apparatus 1910. FIG. 20 shows an apparatus 2000 for machining a generic workpiece 2030, the apparatus 2000 including an apparatus 2010 that generates electron radiation.

Figure 9:
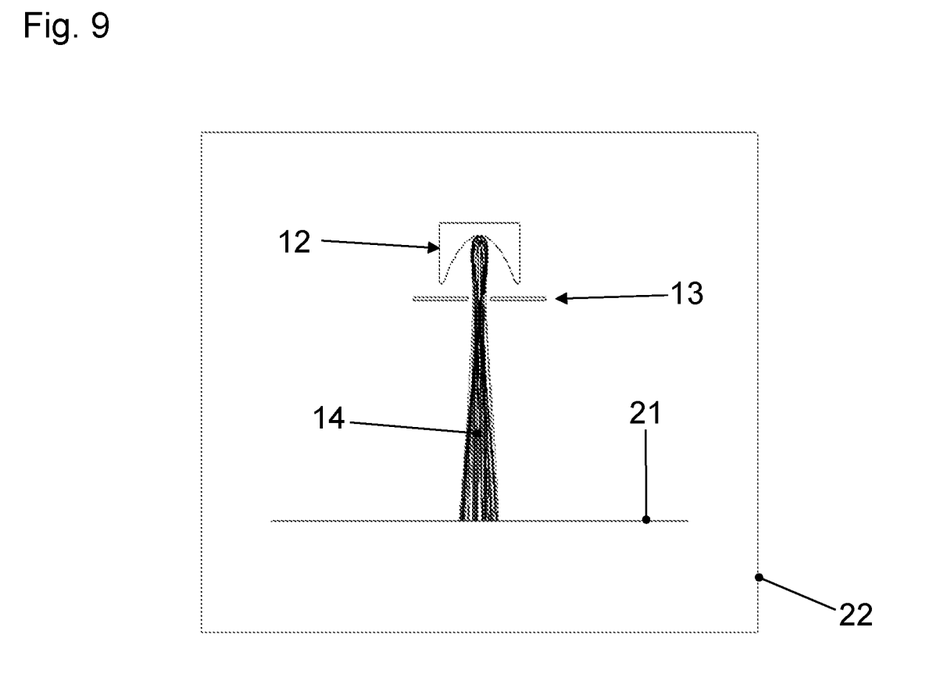
FIG. 9 is, in schematic form, a side view of a fifth embodiment of an apparatus for generating electron radiation, wherein the generated electron radiation is illustrated.
Figure 10:
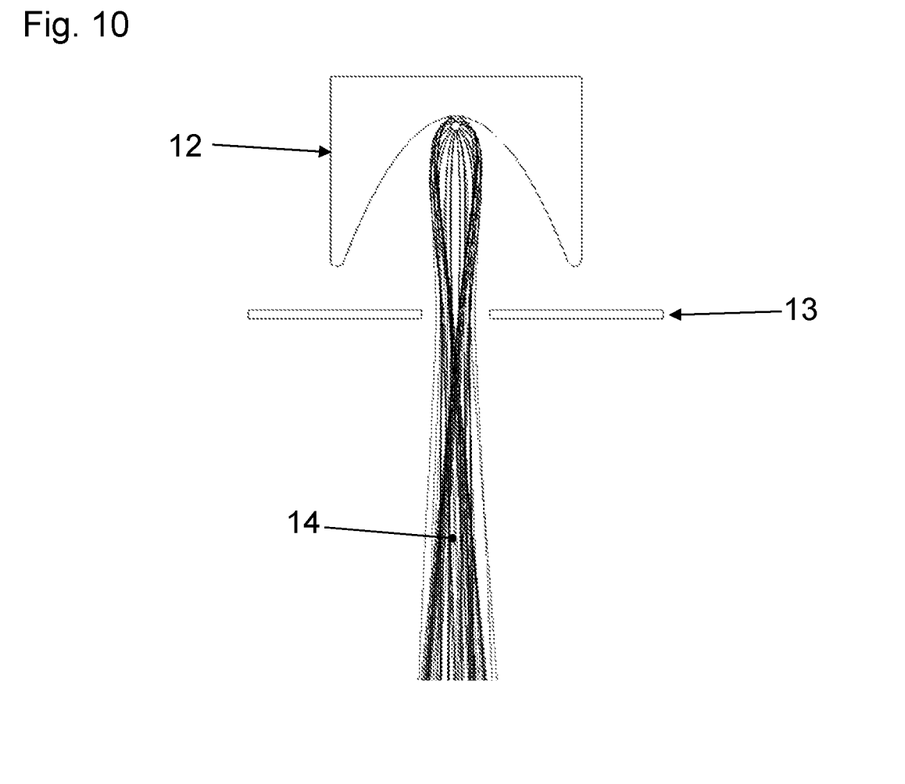
FIG. 10 is an exploded view of a detail from FIG. 9.

In the apparatuses described some or, in particular, all of the parts may be arranged in a vacuum. The housing required to this end is not shown or is not shown in its entirety in the figures. Only FIG. 9 shows a housing 22 in schematic form.

What is claimed is:

1. An apparatus for generating electron radiation, comprising:
   a wire-shaped hot cathode having a longitudinal direction and a transverse direction that is perpendicular to the longitudinal direction, the longitudinal direction being more extensive than the transverse direction, wherein the hot cathode is configured to emit electron radiation in a propagation direction that is perpendicular to the longitudinal direction of the hot cathode, wherein as a result of an elongated shape of the hot cathode, a cross section of the electron radiation is elongated and line-shaped, and wherein an extent of the electron radiation along the cross section is significantly greater than an extent of the electron radiation in the propagation direction;
   a cathode electrode having a curved surface comprising a hollow cylindrical, concavely curved surface on a side facing the hot cathode; and
   an anode, wherein during operation of the apparatus, a voltage emitted from the hot cathode for accelerating electrons is applied between the cathode electrode and the anode,
   wherein the hot cathode is spaced apart from the cathode electrode such that electrons emitted from the hot cathode are accelerated to the anode in a plurality of directions that linearly intersect the propagation direction.

2. The apparatus of claim 1, wherein the surface on the side facing the hot cathode is:
   grooveless, and
   smooth, non-interrupted, or both smooth and non-interrupted.

3. The apparatus of claim 1, wherein the hollow cylindrical, concavely curved surface of the cathode electrode has a vertex line and comprises a surface with a parabola-shaped cross section.

4. The apparatus of claim 3, wherein the distance between the hot cathode and the surface of the cathode electrode in a region of the vertex line of the concave curvature at the extremum of the parabola is less than the distance between the hot cathode and other regions of the surface of the cathode electrode.

5. The apparatus of claim 1, wherein the electrons emitted from the hot cathode in the direction of the cathode electrode are reflected on the surface of or in a region of the surface of the cathode electrode in the direction of the anode or are deflected in the direction of the anode.

6. The apparatus of claim 1, wherein a workpiece to be machined serves as an anode.

7. The apparatus of claim 1, wherein the anode is configured as an anode electrode that has an opening through which the electron radiation emerging from the hot cathode can pass.

8. The apparatus of claim 1, wherein the apparatus comprises a plurality of deflection electrodes to compress, focus, or both compress and focus the electrode radiation.

9. The apparatus of claim 8, wherein the deflection electrodes are arranged behind the anode electrode in the direction of propagation of the electron radiation.

10. A three-dimensional (3D) printing apparatus for producing a spatially extended product, comprising:
    at least one apparatus of claim 1 for generating electron radiation; and
    a working region, to which starting material, to be exposed to electron radiation, for the 3D printing is or can be fed, wherein the working region is arranged in the 3D printing apparatus such that the electron radiation impinges on the starting material.

11. An apparatus for machining a workpiece, comprising at least one apparatus of claim 1 for generating electron radiation.

* * * * *